United States Patent
Ide et al.

(10) Patent No.: US 7,738,218 B2
(45) Date of Patent: *Jun. 15, 2010

(54) MAGNETIC DETECTION HEAD AND METHOD FOR MANUFACTURING THE SAME

(75) Inventors: Yosuke Ide, Niigata-ken (JP); Masamichi Saito, Niigata-ken (JP); Masahiko Ishizone, Niigata-ken (JP); Naoya Hasegawa, Niigata-ken (JP)

(73) Assignee: TDK Corporation, Tokyo (JP)

( * ) Notice: Subject to any disclaimer, the term of this patent is extended or adjusted under 35 U.S.C. 154(b) by 1032 days.

This patent is subject to a terminal disclaimer.

(21) Appl. No.: 11/436,270

(22) Filed: May 17, 2006

(65) Prior Publication Data
US 2006/0268465 A1 Nov. 30, 2006

(30) Foreign Application Priority Data
May 31, 2005 (JP) .............................. 2005-158928

(51) Int. Cl.
*G11B 5/127* (2006.01)

(52) U.S. Cl. ............. 360/313; 360/324.11; 360/324.12; 360/324.1; 360/314

(58) Field of Classification Search .................. 360/313, 360/314, 324.1, 324.11, 324.12
See application file for complete search history.

(56) References Cited

U.S. PATENT DOCUMENTS

| | | | | |
|---|---|---|---|---|
| 5,656,381 | A * | 8/1997 | Maeda et al. | ................ 428/611 |
| 7,295,408 | B2 * | 11/2007 | Saito et al. | ............... 360/324.1 |
| 7,480,122 | B2 * | 1/2009 | Ide et al. | ................ 360/324.12 |
| 7,499,249 | B2 * | 3/2009 | Ide et al. | ................ 360/324.12 |
| 2003/0011945 | A1 | 1/2003 | Yuasa et al. | |
| 2003/0137785 | A1 * | 7/2003 | Saito | ..................... 360/324.11 |
| 2006/0067017 | A1 | 3/2006 | Yuasa et al. | |
| 2006/0227467 | A1 * | 10/2006 | Ide et al. | ................ 360/324.11 |
| 2007/0177310 | A1 | 8/2007 | Yuasa et al. | |
| 2008/0068765 | A1 | 3/2008 | Yuasa et al. | |

FOREIGN PATENT DOCUMENTS

| | | |
|---|---|---|
| JP | 2002/357488 | 12/2002 |
| JP | 2003/8102 A | 1/2003 |
| JP | 2003-218428 | 7/2003 |
| JP | 2003/218428 A | 7/2003 |

\* cited by examiner

*Primary Examiner*—Joseph H Feild
*Assistant Examiner*—Ifedayo Iluyomade
(74) *Attorney, Agent, or Firm*—Brinks Hofer Gilson & Lione

(57) ABSTRACT

A magnetic detection element capable of maintaining the ΔRA at a high level and reducing the magnetostriction by improving a material for a free magnetic layer, as well as a method for manufacturing the same, is provided. The free magnetic layer includes a laminate composed of a CoMnX alloy layer formed from a metal compound represented by a compositional formula $Co_aMn_bX_c$ (where X represents at least one of Ge, Ga, In, Si, Pb, Zn, and Sb and a+b+c=100 atomic percent) and a CoMnZ alloy layer formed from a metal compound represented by a compositional formula $Co_dMn_eZ_f$ (where Z represents at least one of Sn and Al and d+e+f=100 atomic percent). In this manner, the magnetostriction of the free magnetic layer can be reduced.

18 Claims, 5 Drawing Sheets

MAGNETIC DETECTION HEAD AND METHOD FOR MANUFACTURING THE SAME

BACKGROUND OF THE INVENTION

1. Field of the Invention

The present invention relates to a magnetic detection element including a pinned magnetic layer in which the magnetization direction is pinned and a free magnetic layer which is disposed on the above-described pinned magnetic layer with a non-magnetic material layer therebetween and in which the magnetization direction is varied due to an external magnetic field. In particular, it relates to a magnetic detection element capable of maintaining the product ΔRA of a variation of magnetoresistance ΔR and an element area A at a high level and reducing the magnetostriction of the free magnetic layer, as well as a method for manufacturing the same.

2. Description of the Related Art

FIG. 7 is a partial sectional view of a known magnetic detection element (spin-valve type thin film element) cut along a direction parallel to a surface facing a recording medium.

In FIG. 7, reference numeral 1 denotes a substrate layer formed from Ta. A seed layer 2 formed from a metal, e.g., Cr, having a body-centered cubic structure (bcc structure) is disposed on this substrate layer 1.

A multilayer film T1, in which an antiferromagnetic layer 3, a pinned magnetic layer 4, a non-magnetic material layer 5, a free magnetic layer 6, and a protective layer 7 are laminated sequentially, is disposed on the seed layer 2.

The protective layer 7 is formed from Ta, the non-magnetic material layer 5 is formed from Cu, the free magnetic layer 6 and the pinned magnetic layer 4 are formed from a Heusler alloy, e.g., $CO_2MnGe$, and the antiferromagnetic layer 3 is formed from PtMn.

Electrode layers 10 and 10 are disposed on the top and the bottom of the multilayer film T1, and a direct current serving as a sense current is flowed in a direction perpendicular to the film surface of the multilayer film.

An exchange coupling magnetic field is generated at the interface between the antiferromagnetic layer 3 and the pinned magnetic layer 5, and the magnetization of the above-described pinned magnetic layer 5 is pinned in a height direction (Y direction shown in the drawing).

Hard bias layers 8 formed from a hard magnetic material, e.g., CoPt, are disposed on both sides of the free magnetic layer 6, and the top, the bottom, and the end portions of the hard bias layers 8 are insulated by insulating layers 9. The magnetization of the free magnetic layer 6 is aligned in a track-width direction (X direction shown in the drawing) by longitudinal bias magnetic fields from the hard bias layers 8.

When an external magnetic field is applied to the magnetic detection element shown in FIG. 7, the magnetization direction of the free magnetic layer is varied relative to the magnetization direction of the pinned magnetic layer and, thereby, the resistance value of the laminated film is varied. In the case where a sense current is flowed with a constant current value, the external magnetic field is detected by detecting this variation of the resistance value as the variation of voltage.

The magnetic detection element including the free magnetic layer formed from the Heusler alloy is described in Japanese Unexamined Patent Application Publication No. 2003-218428 (US Pub. No. 2003/0137785 A1).

It is known that the product ΔRA of a variation of magnetoresistance ΔR and an element area A can be increased by forming the above-described free magnetic layer primarily from the Heusler alloy. An increase in the above-described ΔRA is one of very important conditions for commercializing a CPP type magnetic detection element directed toward a future increase in recording density.

Although the above-described ΔRA is increased by using the Heusler alloy, the magnetostriction of the free magnetic layer is increased. If the magnetostriction of the free magnetic layer is increased, an influence of stress is increased due to, for example, the film-formation strain and the difference in thermal expansion coefficient between the free magnetic layer and other layers. Furthermore, on the grounds that, for example, noise is caused during the operation of a head, another problem occurs in that the magnetostriction of the above-described free magnetic layer must be reduced while a high ΔRA is maintained.

SUMMARY OF THE INVENTION

The present invention has been made to overcome the above-described known problems. Accordingly, it is an object of the present invention to provide a magnetic detection element capable of maintaining the ΔRA at a high level and reducing the magnetostriction, as well as a method for manufacturing the same.

A magnetic detection element according to an aspect of the present invention includes a pinned magnetic layer in which the magnetization direction is pinned and a free magnetic layer which is disposed on the above-described pinned magnetic layer with a non-magnetic material layer therebetween and in which the magnetization direction is varied due to an external magnetic field, wherein the above-described free magnetic layer includes a laminate composed of a CoMnX alloy layer formed from a metal compound represented by a compositional formula $Co_aMn_bX_c$ (where X represents at least one of Ge, Ga, In, Si, Pb, Zn, and Sb and a+b+c=100 atomic percent) and a CoMnZ alloy layer formed from a metal compound represented by a compositional formula $Co_dMn_eZ_f$ (where Z represents at least one of Sn and Al and d+e+f=100 atomic percent).

In the present aspect, since the above-described free magnetic layer has a laminated structure composed of the CoMnX alloy layer formed from a ternary alloy and the CoMnZ alloy layer likewise formed from a ternary alloy, the magnetostriction of the above-described free magnetic layer can be reduced.

Preferably, the film thickness of the above-described CoMnZ alloy layer is 1.0 angstrom or more and 5.0 angstroms or less per layer.

In the present aspect, a CoMnXZ alloy layer formed from a metal compound represented by a compositional formula $Co_gMn_hX_iZ_j$ (where X represents at least one of Ge, Ga, In, Si, Pb, Zn, and Sb, Z represents at least one of Sn and Al, and g+h+i+j=100 atomic percent) may be disposed between the above-described CoMnX alloy layer and the above-described CoMnZ alloy layer.

In the present aspect, when the lamination configuration in which each of the above-described CoMnX alloy layer and the above-described CoMnZ alloy layer is laminated once is taken as a unit and the film thickness ratio of the CoMnZ alloy layer to the unit is represented by [film thickness of CoMnZ alloy layer/(film thickness of CoMnX alloy layer+film thickness of CoMnZ alloy layer)], preferably, the film thickness ratio of the above-described CoMnZ alloy layer is specified to be 0.2 or more and 0.4 or less.

Preferably, the ratio of a total film thickness of at least one layer of the above-described CoMnZ alloy layer present in the above-described free magnetic layer to a total film thickness of the free magnetic layer ([total film thickness of CoMnZ alloy layer/total film thickness of free magnetic layer]) is specified to be 0.20 or more and 0.80 or less, and more preferably is specified to be 0.20 or more and 0.32 or less.

In the present aspect, preferably, the above-described CoMnX alloy layer is in contact with the above-described non-magnetic material layer.

In the present aspect, preferably, the magnetic detection element includes an antiferromagnetic layer, the above-described pinned magnetic layer which is disposed in contact with the antiferromagnetic layer and in which the magnetization direction is pinned by an exchange anisotropic magnetic field with the above-described antiferromagnetic layer, and the above-described free magnetic layer disposed on the above-described pinned magnetic layer with the above-described non-magnetic material layer therebetween.

In the present aspect, the magnetic detection element may be configured to include non-magnetic material layers laminated on the top and bottom of the above-described free magnetic layer and the above-described pinned magnetic layers located on one of the above-described non-magnetic material layers and under the other non-magnetic material layer. In this case, it is preferable that the magnetic detection element includes antiferromagnetic layers which are located on one of the above-described pinned magnetic layers and under the other pinned magnetic layer and which pin the magnetization directions of their respective pinned magnetic layers in a constant direction by exchange anisotropic magnetic fields.

In particular, the present aspect of the invention can be effectively applied to the structure of a CPP type magnetic detection element, wherein a sense current is flowed in a direction perpendicular to the film surfaces of the above-described pinned magnetic layer, the non-magnetic material layer, and the free magnetic layer.

A method according to another aspect of the present invention is a method for manufacturing a magnetic detection element including a pinned magnetic layer in which the magnetization direction is pinned and a free magnetic layer which is disposed on the above-described pinned magnetic layer with a non-magnetic material layer therebetween and in which the magnetization direction is varied due to an external magnetic field, the method including the step of disposing the above-described free magnetic layer as a laminate composed of a CoMnX alloy layer formed from a metal compound represented by a compositional formula $Co_aMn_bX_c$ (where X represents at least one of Ge, Ga, In, Si, Pb, Zn, and Sb and a+b+c=100 atomic percent) and a CoMnZ alloy layer formed from a metal compound represented by a compositional formula $Co_dMn_eZ_f$ (where Z represents at least one of Sn and Al and d+e+f=100 atomic percent).

Preferably, the film thickness of the above-described CoMnZ alloy layer is specified to be 1.0 angstrom or more and 5.0 angstroms or less.

When the lamination configuration in which each of the above-described CoMnX alloy layer and the above-described CoMnZ alloy layer is laminated once is taken as a unit and the film thickness ratio of the above-described CoMnZ alloy layer to the unit is represented by [film thickness of CoMnZ alloy layer/(film thickness of CoMnX alloy layer+film thickness of CoMnZ alloy layer)], preferably, the film thickness ratio of the above-described CoMnZ alloy layer is specified to be 0.2 or more and 0.4 or less.

Preferably, the ratio of a total film thickness of at least one layer of the above-described CoMnZ alloy layer present in the above-described free magnetic layer to a total film thickness of the free magnetic layer ([total film thickness of CoMnZ alloy layer/total film thickness of free magnetic layer]) is specified to be 0.20 or more and 0.80 or less, and more preferably is specified to be 0.20 or more and 0.32 or less.

In the present aspect, preferably, the above-described CoMnX alloy layer is disposed in contact with the above-described non-magnetic material layer.

In the present aspect, preferably, the above-described magnetic detection element is subjected to a heat treatment after the above-described magnetic detection element is formed. In this manner, the above-described CoMnX alloy layer and the CoMnZ alloy layer are ordered to have an $L_{21}$ type or a $B_2$ type crystal structure.

In the present aspect, since the above-described free magnetic layer has a laminated structure composed of the CoMnX alloy layer formed from a ternary alloy and the CoMnZ alloy layer likewise formed from a ternary alloy, the magnetostriction of the above-described free magnetic layer can be reduced.

In this manner, the magnetostriction of the free magnetic layer can be reduced while the ΔRA is maintained at a high value.

DESCRIPTION OF THE PREFERRED EMBODIMENTS

Figure 1:
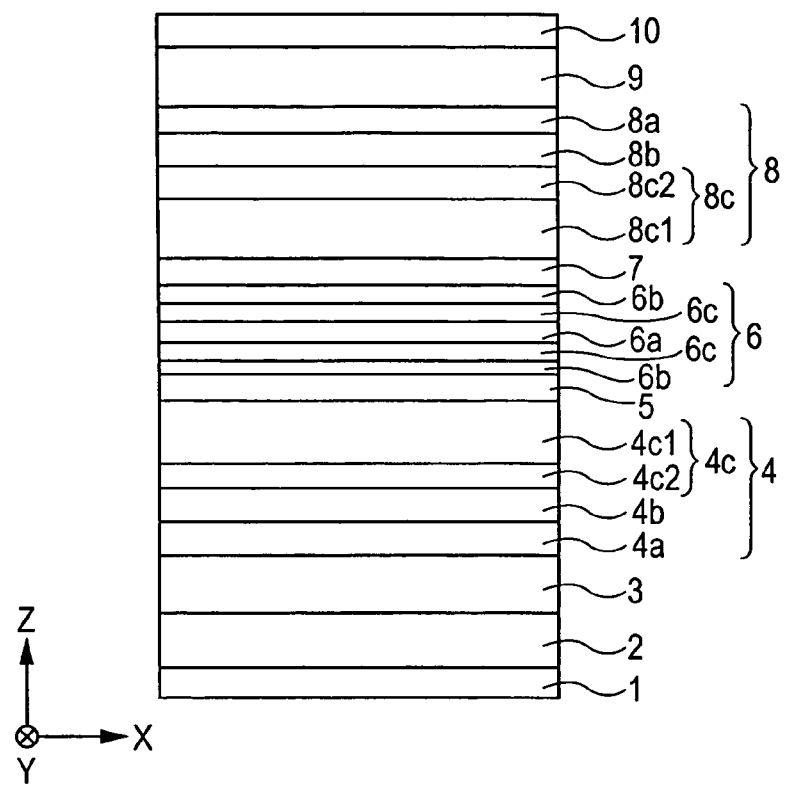
FIG. 1 is a schematic diagram of the structure of a magnetic detection element (dual spin-valve type thin film element) according to a first embodiment of the present invention, viewed from the side of a surface facing a recording medium.

FIG. 1 is a schematic diagram showing the laminated structure of a CPP dual spin-valve type thin film element according to an embodiment of the present invention.

This dual spin-valve type thin film element is disposed at, for example, a trailing-side end portion of a flying slider disposed in a hard disk device and is used for detecting a recording magnetic field of a hard disk or the like. The movement direction of the magnetic recording medium, e.g., the hard disk, is the Z direction and the direction of a leakage magnetic field from the magnetic recording medium is the Y direction.

In FIG. 1, a substrate layer 1 formed from a non-magnetic material, e.g., at least one type of elements of Ta, Hf, Nb, Zr, Ti, Mo, and W, is disposed as a lowermost layer. A seed layer 2 is disposed on this substrate layer 1. The above-described seed layer 2 is formed from NiFeCr or Cr. When the above-described seed layer 2 is formed from NiFeCr, the above-described seed layer 2 has a face-centered cubic (fcc) structure in which an equivalent crystal surface represented by a {111} surface is preferentially oriented in a direction parallel to the film surface. When the above-described seed layer 2 is formed from Cr, the above-described seed layer 2 has a body-centered cubic (bcc) structure in which an equivalent crystal surface represented by a {110} surface is preferentially oriented in a direction parallel to the film surface.

The substrate layer 1 has a structure close to an amorphous state. However, this substrate layer 1 may not be disposed.

Preferably, an antiferromagnetic layer 3 disposed on the above-described seed layer 2 is formed from an antiferromagnetic material containing an element X (where X represents at least one type of elements of Pt, Pd, Ir, Rh, Ru, and Os) and Mn.

The X—Mn alloys including these platinum group elements have excellent properties for antiferromagnetic materials. For example, excellent corrosion resistance is exhibited, the blocking temperature is high and, furthermore, the exchange coupling magnetic field (Hex) can be increased.

In the present embodiment, the above-described antiferromagnetic layer 3 may be formed from an antiferromagnetic material containing the element X, an element X' (where the element X' represents at least one type of elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements), and Mn.

Preferably, the atomic percent of the element X or the elements X+X' in the above-described antiferromagnetic layer 3 is set at 45 atomic percent or more and 60 atomic percent or less. More preferably, the atomic percent is set at 49 atomic percent or more and 56.5 atomic percent or less. In this manner, it is estimated that the interface to a pinned magnetic layer 4 is brought into a noncoherent state and the above-described antiferromagnetic layer 3 undergoes an appropriate order transformation by a heat treatment in a stage of the film formation.

A lower pinned magnetic layer 4 is formed with a multi-layer structure composed of a first pinned magnetic layer 4a, a non-magnetic intermediate layer 4b, and a second pinned magnetic layer 4c. The magnetization directions of the above-described first pinned magnetic layer 4a and the second pinned magnetic layer 4c are brought into a mutually antiparallel state by an exchange coupling magnetic field at the interface to the above-described antiferromagnetic layer 3 and an antiferromagnetic exchange coupling magnetic field (RKKY interaction) through the non-magnetic intermediate layer 4b. This is referred to as a so-called laminated ferrimagnetic structure. By this configuration, the magnetization of the lower pinned magnetic layer 4 can be brought into a stable state, and an exchange coupling magnetic field generated at the interface between the above-described lower pinned magnetic layer 4 and the antiferromagnetic layer 3 can apparently be increased.

However, the above-described lower pinned magnetic layer 4 may be composed of the second pinned magnetic layer 4c alone and may not have the laminated ferrimagnetic structure.

The above-described first pinned magnetic layer 4a is formed with a thickness of about 15 angstroms to 35 angstroms, for example. The non-magnetic intermediate layer 4b is formed with a thickness of about 8 angstroms to 10 angstroms, and the second pinned magnetic layer 4c is formed with a thickness of about 20 angstroms to 60 angstroms.

The first pinned magnetic layer 4a is formed from a ferromagnetic material, e.g., CoFe, NiFe, or CoFeNi. The non-magnetic intermediate layer 4b is formed from a non-magnetic electrically conductive material, e.g., Ru, Rh, Ir, Cr, Re, or Cu.

A film of the second pinned magnetic layer 4c is formed taking on a two-layer structure composed of a CoMnX alloy layer 4c1 (where the element X represents at least one type of elements of Ge, Ga, In, Si, Pb, Zn, and Sb) in contact with a non-magnetic material layer 5 and a non-magnetic intermediate layer-side magnetic layer 4c2. The above-described non-magnetic intermediate layer-side magnetic layer 4c2 is formed from a ferromagnetic material, e.g., NiFe, CoFeNi, and CoFe. In particular, preferably, both the above-described first pinned magnetic layer 4a and the non-magnetic intermediate layer-side magnetic layer 4c2 are formed from a CoFe alloy. In this manner, the RKKY interaction generated between the above-described non-magnetic intermediate layer-side magnetic layer 4c2 and the above-described first pinned magnetic layer 4a is increased, and the magnetization of the above-described first pinned magnetic layer 4a and the second pinned magnetic layer 4c can be pinned strongly.

The non-magnetic material layer 5 disposed on the above-described pinned magnetic layer 4 is formed from Cu, Au, or Ag. The non-magnetic material layer 5 formed from Cu, Au, or Ag has a face-centered cubic (fcc) structure in which an equivalent crystal surface represented by a {111} surface is preferentially oriented in a direction parallel to the film surface.

A free magnetic layer 6 is disposed on the above-described non-magnetic material layer 5. A non-magnetic material layer 7 is disposed on the above-described free magnetic layer 6, and the material is selected from the materials used for the above-described non-magnetic material layer 5. An upper pinned magnetic layer 8 is disposed on the above-described non-magnetic material layer 7. The above-described upper pinned magnetic layer 8 has a laminated ferrimagnetic structure in which a second pinned magnetic layer 8c, a non-magnetic intermediate layer 8b, and a first pinned magnetic layer 8a are laminated in that order from the bottom. Materials for the above-described first pinned magnetic layer 8a, the non-magnetic intermediate layer 8b, and the second pinned magnetic layer 8c are selected from the materials used for the above-described first pinned magnetic layer 4a, the non-magnetic intermediate layer 4b, and the second pinned magnetic layer 4c, respectively. As in the above-described second pinned magnetic layer 4c, a film of the second pinned magnetic layer 8c is formed taking on a two-layer structure composed of a CoMnX alloy layer 8c1 in contact with the non-magnetic material layer 7 and a non-magnetic intermediate layer-side magnetic layer 8c2. The upper pinned magnetic layer 8 may be composed of the second pinned magnetic layer 8c alone.

An upper antiferromagnetic layer 9 is disposed on the above-described upper pinned magnetic layer 8. The material for the above-described upper antiferromagnetic layer 9 is selected from the materials used for the lower antiferromagnetic layer 3. A protective layer 10 formed from Ta or the like is disposed on the upper antiferromagnetic layer 9.

The above-described free magnetic layer 6 has been magnetized in a direction parallel to the track-width direction (the X direction shown in the drawing). On the other hand, the first pinned magnetic layers 4a and 8a and the second pinned magnetic layers 4c and 8c constituting the pinned magnetic layers 4 and 8 have been magnetized in a direction parallel to the height direction (the Y direction shown in the drawing). Since the above-described pinned magnetic layers 4 and 8 have the laminated ferrimagnetic structure, the first pinned magnetic layers 4a and 8a and the second pinned magnetic layers 4c and 8c have been magnetized antiparallel to each other.

In the present embodiment, the free magnetic layer 6 includes a laminate composed of a CoMnX alloy layer 6a formed from a metal compound represented by a compositional formula $Co_aMn_bX_c$ (where X represents at least one of Ge, Ga, In, Si, Pb, Zn, and Sb and a+b+c=100 atomic percent) and a CoMnZ alloy layer 6b formed from a metal compound represented by a compositional formula $Co_dMn_eZ_f$ (where Z represents at least one of Sn and Al and d+e+f=100 atomic percent).

In this manner, the magnetostriction of the free magnetic layer 6 can be reduced.

Preferably, the film thickness of the above-described CoMnZ alloy layer is 1.0 angstrom or more and 5.0 angstroms or less per layer.

In the present embodiment, a CoMnXZ alloy layer 6c formed from a metal compound represented by a compositional formula $Co_gMn_hX_iZ_j$ (where X represents at least one of Ge, Ga, In, Si, Pb, Zn, and Sb, Z represents at least one of Sn and Al, and g+h+i+j=100 atomic percent) is disposed between the CoMnX alloy layer 6a and the CoMnZ alloy layer 6b.

The CoMnX alloy layer 6a is a layer containing simply Co, Mn, and X, and the CoMnZ alloy layer 6b is a layer containing simply Co, Mn, and Z. The CoMnXZ alloy layer 6c is a layer formed by diffusion of materials for the CoMnX alloy layer 6a and the materials for the CoMnZ alloy layer 6b. Therefore, the X content in the CoMnXZ alloy layer 6c increases with increasing proximity to the CoMnX alloy layer 6a, and the Z content increases with increasing proximity to the CoMnZ alloy layer 6b.

In FIG. 1, one CoMnZ alloy layer 6b is disposed on each of the top and the bottom of the CoMnX alloy layer 6a. However, the number of lamination of the CoMnX alloy layer 6a and the CoMnZ alloy layer 6b is determined at will.

When the lamination configuration in which each of the CoMnX alloy layer 6a and the CoMnZ alloy layer 6b is laminated once is taken as a unit and the film thickness ratio of the CoMnZ alloy layer 6b to the unit is represented by [film thickness of CoMnZ alloy layer/(film thickness of CoMnX alloy layer+film thickness of CoMnZ alloy layer)], preferably, the film thickness ratio of the above-described CoMnZ alloy layer is specified to be 0.2 or more and 0.4 or less.

Preferably, the ratio of a total film thickness of at least one layer of the CoMnZ alloy layer present in the free magnetic layer 6 to a total film thickness of the free magnetic layer 6 ([total film thickness of CoMnZ alloy layer/total film thickness of free magnetic layer]) is specified to be 0.20 or more and 0.80 or less, and more preferably is specified to be 0.20 or more and 0.32 or less.

When the film thickness ratios are specified to be within these ranges, the magnetostriction can be reduced significantly, and the ΔRA of the magnetic detection element can be maintained at a high level.

As shown in FIG. 1, the CoMnZ alloy layers 6b are in contact with the non-magnetic material layers 5 and 7. Consequently, in particular, diffusion of the X element of the above-described CoMnX alloy layer 6a into the above-described non-magnetic material layers 5 and 7 can be prevented appropriately. Alternatively, the CoMnX alloy layers 6a may be in contact with the non-magnetic material layers 5 and 7.

Figure 2:
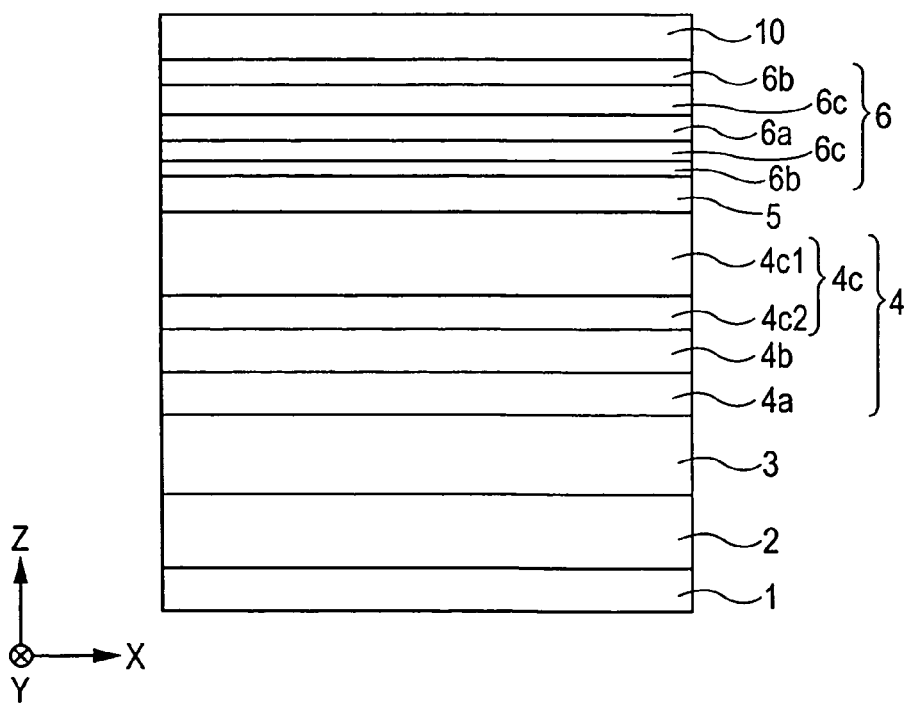
FIG. 2 is a schematic diagram of the structure of a magnetic detection element (single spin-valve type thin film element) according to a second embodiment of the present invention, viewed from the side of a surface facing a recording medium.

FIG. 2 is a schematic diagram showing the film configuration of a CPP single spin-valve type thin film element. The layers indicated by the same reference numerals as the reference numerals shown in FIG. 1 are the same layers as those shown in FIG. 1.

In the film configuration of the CPP single spin-valve type thin film element shown in FIG. 2, a substrate layer 1, a seed layer 2, an antiferromagnetic layer 3, a pinned magnetic layer 4, a non-magnetic material layer 5, a free magnetic layer 6, and a protective layer 10 are laminated in that order from the bottom. In the CPP single spin-valve type thin film element shown in FIG. 2 as well, a CoMnXZ alloy layers 6c are disposed in the free magnetic layer 6. Alternatively, the free magnetic layer 6, the non-magnetic material layer 5, the pinned magnetic layer 4, and the antiferromagnetic layer 3 may be laminated in that order from the bottom in the CPP single spin-valve type thin film element.

Figure 3:
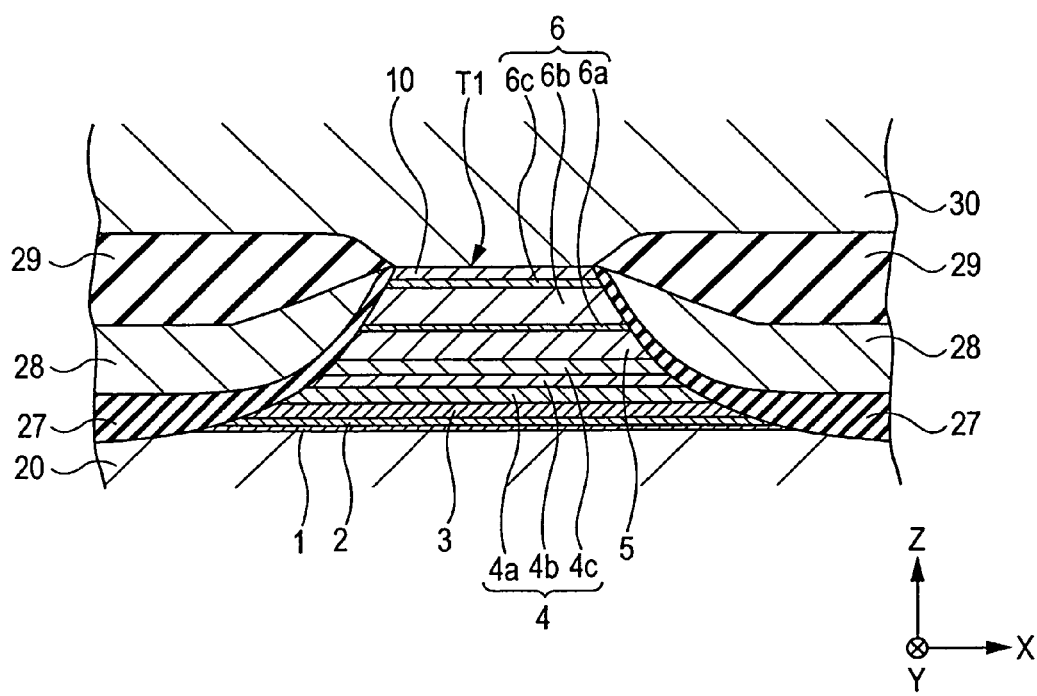
FIG. 3 is a partial sectional view of a reproduction head having a structure of the magnetic detection element shown in FIG. 2, viewed from the side of a surface facing a recording medium.

FIG. 3 is a partial sectional view of a reproduction head having a structure of the CPP single spin-valve type thin film element shown in FIG. 2, viewed from the side of a surface facing a recording medium.

Reference numeral 20 denotes a lower shield layer formed from a magnetic material, and a laminated film T1 having the same configuration as the film configuration shown in FIG. 2 is disposed on the above-described lower shield layer 20.

In the above-described laminated film T1, a substrate layer 1, a seed layer 2, an antiferromagnetic layer 3, a pinned magnetic layer 4, a non-magnetic material layer 5, a free magnetic layer 6, and a protective layer 10 are laminated in that order from the bottom. In the embodiment shown in FIG. 3, insulating layers 27, hard bias layers 28, and insulating layers 29 are laminated on both sides of the above-described multilayer film T1. The magnetization of the free magnetic layer 6 is aligned in a track-width direction (X direction shown in the drawing) by longitudinal bias magnetic fields from the hard bias layers 28.

Bias substrate layers (not shown in the drawing) may be disposed between the above-described insulating layers 27 and the above-described hard bias layers 28. The above-described bias substrate layer is formed from Cr, W, a W—Ti alloy, a Fe—Cr alloy, or the like.

The above-described insulating layers 27 and 29 are formed from an insulating material, e.g., $Al_2O_3$ or $SiO_2$, and insulate the top and the bottom of the above-described hard bias layer 28 in such a way that the current flowing through the above-described multilayer film T1 in a direction perpendicular to the interfaces of individual layers is prevented from diverting to both sides of the above-described multilayer film T1 in the track-width direction.

The above-described hard bias layers 28 and 28 are formed from a cobalt-platinum (Co—Pt) alloy, a cobalt-chromium-platinum (Co—Cr—Pt) alloy, or the like.

An upper shield layer 30 formed from a magnetic material is disposed on the insulating layers 29 and the protective layer 10. In the CPP spin-valve type thin film element, the lower shield layer 20 and the upper shield layer 30 function as electrodes, and serve as current sources for flowing a current in a direction perpendicular to the interfaces of individual layers constituting the above-described multilayer film T1.

The magnetization of the free magnetic layer 6 is aligned in a direction parallel to the track-width direction (X direction shown in the drawing) by longitudinal bias magnetic fields from the hard bias layers 28 and 28. The magnetization of the free magnetic layer 6 is varied with high sensitivity to the signal magnetic field (external magnetic field) from a recording medium. On the other hand, the magnetization of the pinned magnetic layer 4 is pinned in a direction parallel to the height direction (Y direction shown in the drawing).

An electric resistance is varied in relation to variations in the magnetization direction of the free magnetic layer 6 and the pinned magnetization direction of the pinned magnetic layer 4 (in particular, the pinned magnetization direction of the second pinned magnetic layer 4c). A leakage magnetic field from a recording medium is detected by a change in voltage or a change in current based on a change in the value of this electric resistance. The above-described free magnetic layer 6 is configured to include a CoMnX alloy layer 6a, a CoMnZ alloy layer 6b, and a CoMnXZ alloy layer 6c. The second pinned magnetic layer 4c includes a CoMnX alloy layer 4c1 and a non-magnetic intermediate layer-side magnetic layer 4c2.

Figure 4:
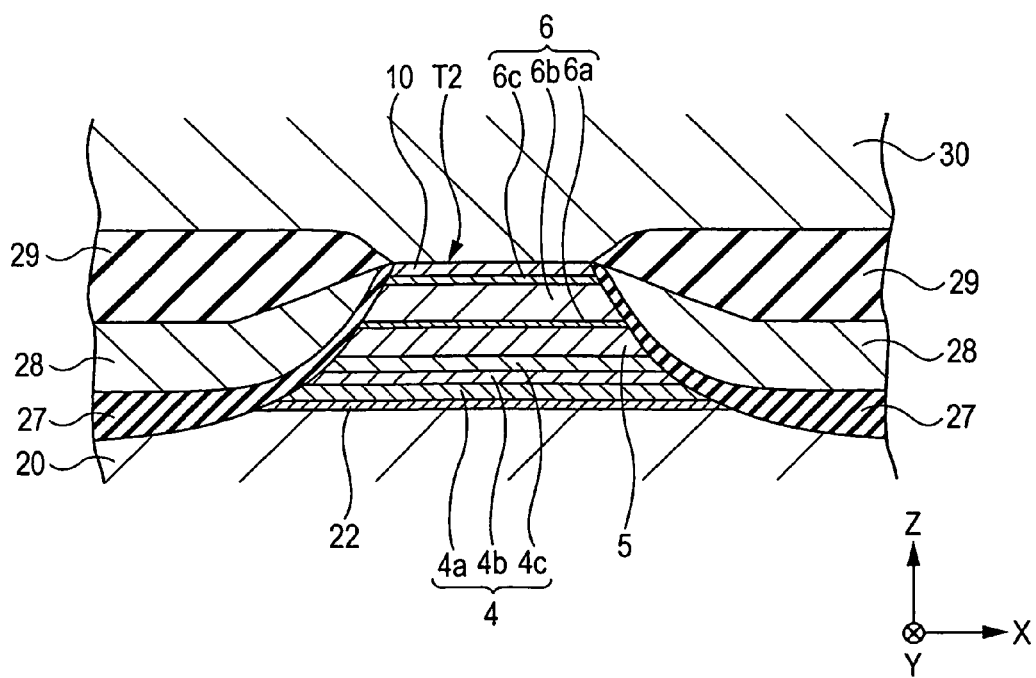
FIG. 4 is a partial sectional view of a reproduction head having a structure of a magnetic detection element with a layer structure different from that shown in FIG. 3, viewed from the side of a surface facing a recording medium.

FIG. 4 is a partial sectional view of a reproduction head having a structure of a CPP single spin-valve type thin film element with a configuration different from that shown in FIG. 3, viewed from the side of a surface facing a recording medium.

In contrast to the configuration shown in FIG. 3, the antiferromagnetic layer 3 is not disposed in the configuration shown in FIG. 4. FIG. 4 shows a so-called self-pinning type magnetic detection element, wherein the magnetization of the pinned magnetic layer 4 is pinned by the uniaxial anisotropy of the pinned magnetic layer itself.

In FIG. 4, a magnetostriction-enhancing layer 22 formed from a simple substance element, e.g., Pt, Au, Pd, Ag, Ir, Rh, Ru, Re, Mo, or W, an alloy composed of at least two types of these elements, or an R—Mn (where the element R is at least one type of elements of Pt, Pd, Ir, Rh, Ru, Os, Ni, and Fe) alloy is disposed with a film thickness of about 5 angstroms or more and 50 angstroms or less under the above-described pinned magnetic layer 4.

The magnetoelastic energy is increased by increasing the magnetostrictive constant λs of the pinned magnetic layer 4 and, thereby, the uniaxial anisotropy of the pinned magnetic layer 4 is increased. When the uniaxial anisotropy of the pinned magnetic layer 4 is increased, the magnetization of the pinned magnetic layer 4 is strongly pinned in a constant direction, the output of the magnetic detection element is increased, and the stability of output and the symmetry are also improved.

In the magnetic detection element shown in FIG. 4, the magnetostriction-enhancing layer 22 formed from a non-magnetic metal is disposed on a surface opposite to the above-described non-magnetic material layer 5 side of a first pinned magnetic layer 4a constituting the pinned magnetic layer 4 while being in contact with the above-described first pinned magnetic layer 4a. In this manner, strain is generated in the crystal structure particularly on the bottom surface side of the first pinned magnetic layer 4a, and the magnetostrictive constant λs of the first pinned magnetic layer 4a is increased. Consequently, the uniaxial anisotropy of the above-described pinned magnetic layer 4 is increased, and the above-described pinned magnetic layer 4 can be strongly pinned in a direction parallel to the height direction (Y direction shown in the drawing) even when the antiferromagnetic layer 3 is not disposed.

The above-described free magnetic layer 6 is configured to include a CoMnX alloy layer 6a, a CoMnZ alloy layer 6b, and a CoMnXZ alloy layer 6c. The second pinned magnetic layer 4c includes a CoMnX alloy layer 4c1 and a non-magnetic intermediate layer-side magnetic layer 4c2.

With respect to FIG. 3 and FIG. 4, in particular, the single spin-valve type thin film elements are described. However, the dual spin-valve type thin film element shown in FIG. 1 may be formed with a similar layer structure.

Figure 5:
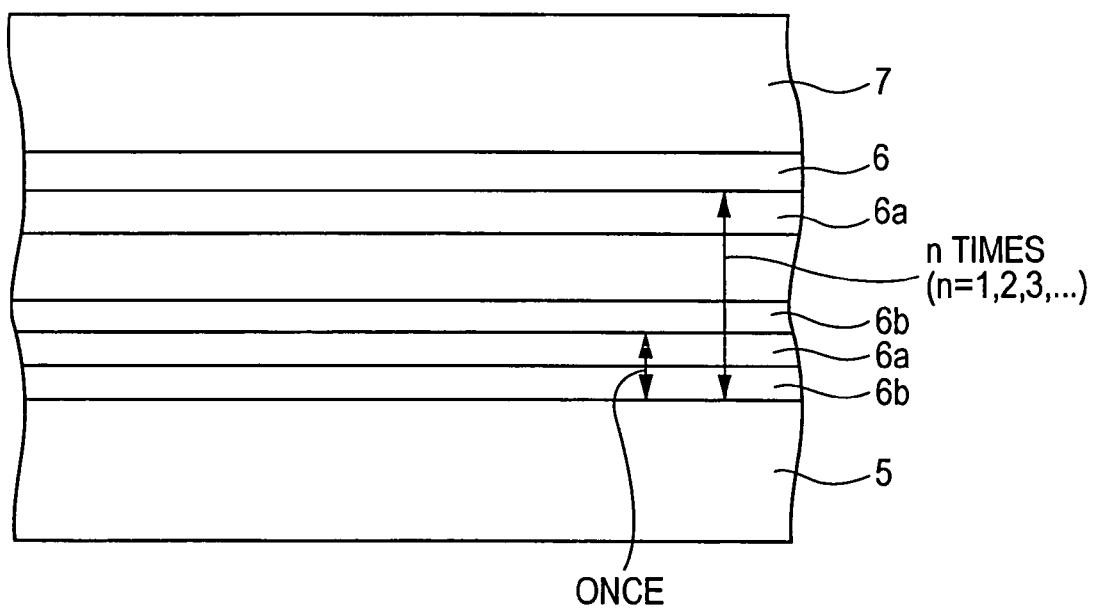
FIG. 5 is a step diagram (schematic diagram) for explaining a method for manufacturing the dual spin-valve type thin film element shown in FIG. 1.

FIG. 5 is a step diagram showing a manufacturing method for forming the film configuration of the dual spin-valve type thin film element shown in FIG. 1. FIG. 5 is a magnified partial schematic diagram of the film configuration of the dual spin-valve type thin film element during the manufacturing step.

Films of the substrate layer 1, the seed layer 2, the antiferromagnetic layer 3, the pinned magnetic layer 4, and the non-magnetic material layer 5 are formed by a sputtering method or an evaporation method. The material for each layer is as described in the explanation for FIG. 1.

As shown in FIG. 5, the CoMnZ alloy layer 6b is formed on the above-described non-magnetic material layer 5 by the sputtering method or the evaporation method and, furthermore, the CoMnX alloy layer 6a is formed on the above-described CoMnZ alloy layer 6b by the sputtering method or the evaporation method. The CoMnZ alloy layer 6b is a layer formed from a metal compound represented by a compositional formula $Co_dMn_eZ_f$ (where Z represents at least one of Sn and Al, d+e+f=100 atomic percent, and d:e:f=2:1:1). The CoMnX alloy layer 6a is a layer formed from a metal compound represented by a compositional formula $Co_aMn_bX_c$ (where the element X represents at least one of Ge, Ga, In, Si, Pb, Zn, and Sb, a+b+c=100 atomic percent, and a:b:c=2:1:1). A laminate in which each of the CoMnZ alloy layer 6b and the CoMnX alloy layer 6a is laminated once is taken as a unit (the number of the lamination is once), and lamination is conducted until the above-described number of lamination reaches n times (n=1, 2, . . . ). After the above-described CoMnZ alloy layer 6b is formed on the above-described CoMnX alloy layer 6a formed as the uppermost layer, a film of the non-magnetic material layer 7 is formed by the sputtering method, the evaporation method, or the like.

Furthermore, films of the pinned magnetic layer 8, the above-described antiferromagnetic layer 9, and the protective layer 10 are formed by the sputtering method, the evaporation method, or the like.

Alternatively, the CoMnX alloy layers 6a may be brought into contact with the non-magnetic material layers 5 and 7.

The layers from the substrate layer 1 to protective layer 10 are laminated and, thereafter, a heat treatment (290° C., 3.5 hours) is conducted. In this manner, exchange coupling magnetic fields are generated at the interfaces between the above-described antiferromagnetic layers 3 and 9 and the first pinned magnetic layers 4a and 8a constituting the pinned magnetic layers 4 and 8, and the above-described first pinned magnetic layers 4a and 8a are magnetized in a direction parallel to the height direction (Y direction shown in the drawing). RKKY interactions take place between the first pinned magnetic layers 4a and 8a and the second pinned magnetic layers 4c and 8c, and the above-described second pinned magnetic layers 4c and 8c are magnetized antiparallel to the magnetization direction of the above-described first pinned magnetic layers 4a and 8a.

In the above-described free magnetic layer 6, diffusion of the materials for the CoMnZ alloy layer 6b and the materials for the CoMnX alloy layer 6a is caused by the above-described heat treatment, so that the CoMnXZ alloy layer 6c, as shown in FIG. 1, is formed.

Preferably, the film thickness of the above-described CoMnZ alloy layer 6b is specified to be within the range of 1.0 angstrom or more and 5.0 angstroms or less. When the film thickness of the above-described CoMnZ alloy layer 6b is increased, an effect of reducing the magnetostriction can be expected. However, inversely, a reduction in the ΔRA is facilitated. Therefore, it is important to adjust the ratio of the film thickness of the above-described CoMnZ alloy layer 6b to the film thickness of the above-described CoMnX alloy layer 6a. In the present embodiment, when the lamination configuration in which each of the above-described CoMnZ alloy layer 6b and the CoMnX alloy layer 6a is laminated once is taken as a unit and the film thickness ratio of the above-described CoMnZ alloy layer 6b to the unit is represented by [film thickness of CoMnZ alloy layer 6b/(film thickness of CoMnX alloy layer 6a+film thickness of CoMnZ alloy layer 6b)], preferably, the film thickness ratio of the above-described CoMnZ alloy layer 6b is specified to be 0.2 or more and 0.4 or less.

Preferably, the ratio of a total film thickness of a plurality of CoMnZ alloy layers 6b present in the free magnetic layer 6 to a total film thickness of the free magnetic layer 6 ([total film thickness of CoMnZ alloy layer/total film thickness of free magnetic layer]) is specified to be 0.20 or more and 0.80 or less, and more preferably is specified to be 0.20 or more and 0.32 or less.

When the film thickness ratios are specified to be within these ranges, the magnetostriction can be reduced significantly, and the ΔRA of the magnetic detection element can be maintained at a high level.

Preferably, the film thickness of the CoMnX alloy layer 6a is within the range of 5 angstroms to 40 angstroms.

In the method for manufacturing the CPP spin-valve type thin film element shown in FIG. 5, the free magnetic layer 6 is formed by alternately laminating the CoMnZ alloy layer 6b and the CoMnX alloy layer 6a, so that the CPP spin-valve type thin film element capable of increasing the ΔRA and reducing the magnetostriction of the free magnetic layer 6 can be formed by a simple manufacturing method without specifically modifying an already-existing manufacturing facilities.

EXAMPLES

A dual spin-valve type thin film element having the following film configuration was manufactured.

The basic film configuration was substrate layer 1: Ta (30)/seed layer 2: NiFeCr (50)/lower antiferromagnetic layer 3: IrMn (70)/lower pinned magnetic layer 4 [first pinned magnetic layer 4a: FeCo (30)/non-magnetic intermediate layer 4b: Ru (9.1)/non-magnetic intermediate layer-side magnetic layer 4c2: FeCo (10)/CoMnX alloy layer 4c1: CoMnGe (40)]/non-magnetic material layer 5: Cu (43)/free magnetic layer 6/non-magnetic material layer 7: Cu (43)/upper pinned magnetic layer 8 [CoMnX alloy layer 8c1: CoMnGe (40)/non-magnetic intermediate layer-side magnetic layer 8c2: FeCo (10)/non-magnetic magnetic intermediate layer 8b: Ru (9.1)/first pinned magnetic layer 8a: FeCo (30)]/upper antiferromagnetic layer 9: IrMn (70)]/protective layer 10: Ta (30), where a number in parentheses represents a film thickness in the unit angstrom.

In the experiment, the following samples were prepared, wherein the lamination configuration (before a heat treatment) of the above-described free magnetic layer 6 was changed variously. The lamination configuration of the free magnetic layer 6 in each sample is as described below.

Sample

Comparative Example 1

CoMnGe (100)

Sample

Example 1

[CoMnGe (9)/CoMnSn (5)]×7/CoMnGe (10)

Sample

Example 2

[CoMnGe (16)/CoMnSn (5)]×4/CoMnGe (16)

Sample

Example 3

CoMnGe (10)/CoMnSn (80)/CoMnGe (10)

In the notation of the lamination configuration of the above-described free magnetic layer, a number in parentheses indicates a film thickness (angstrom), a term "×7" refers to that a film configuration in square brackets is laminated 7 times, and a term "×4" refers to that a film configuration in square brackets is laminated 4 times. For all samples, the compositional ratio of the element Co, the element Mn, and the element Ge in the CoMnGe alloy is 2:1:1, and the compositional ratio of the element Co, the element Mn, and the element Sn in the CoMnSn alloy is 2:1:1.

After each of the above-described samples were formed, each sample was subjected to a heat treatment.

The magnetostriction constant λs of the free magnetic layer of each sample was measured after the heat treatment, and the ΔRA of each sample was measured. The results thereof are shown in FIG. 6.

Figure 6:
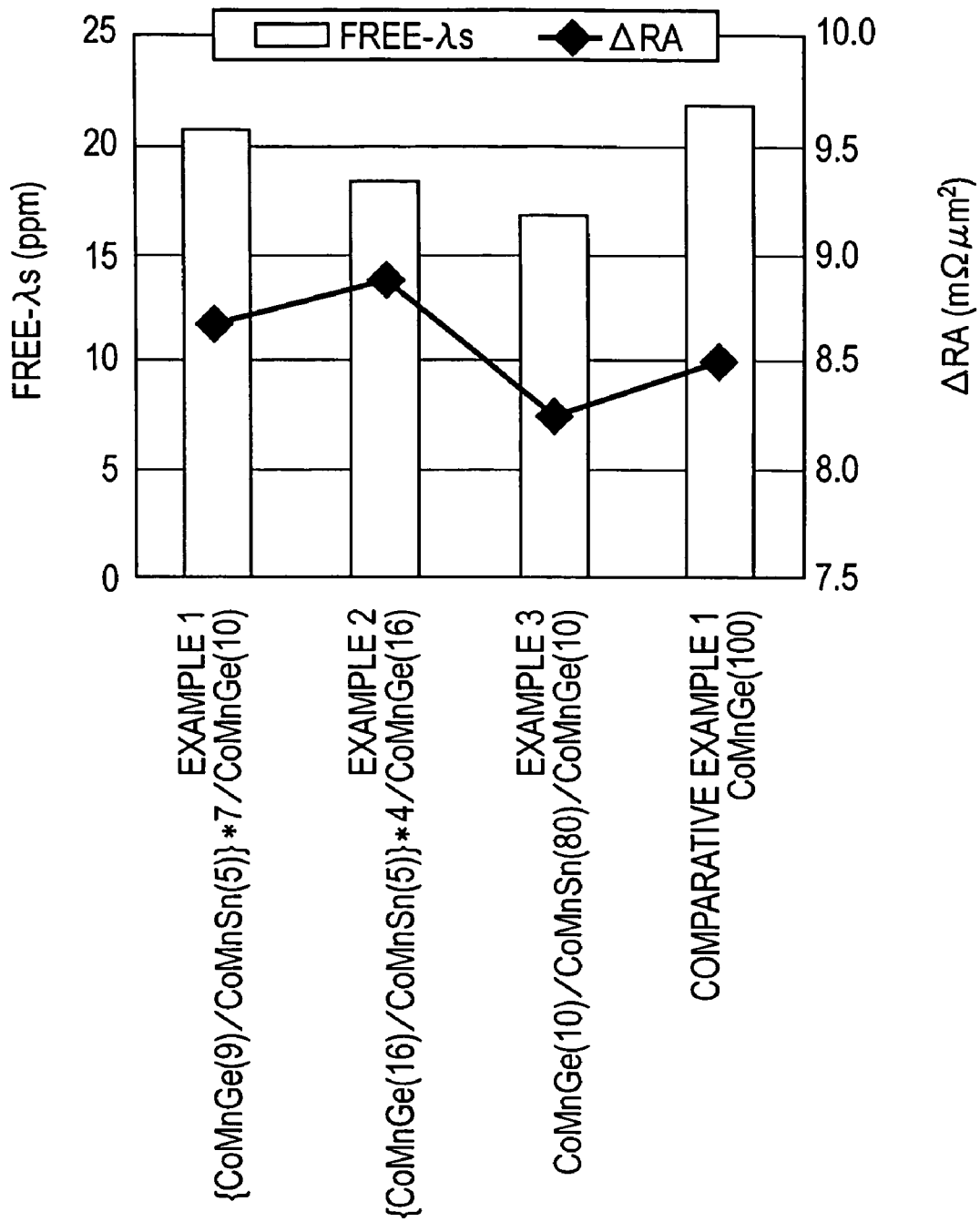
FIG. 6 is a graph showing the relationships between the composition and the magnetostriction λs of the free magnetic layer and between the composition and the ΔRA.
Figure 7:
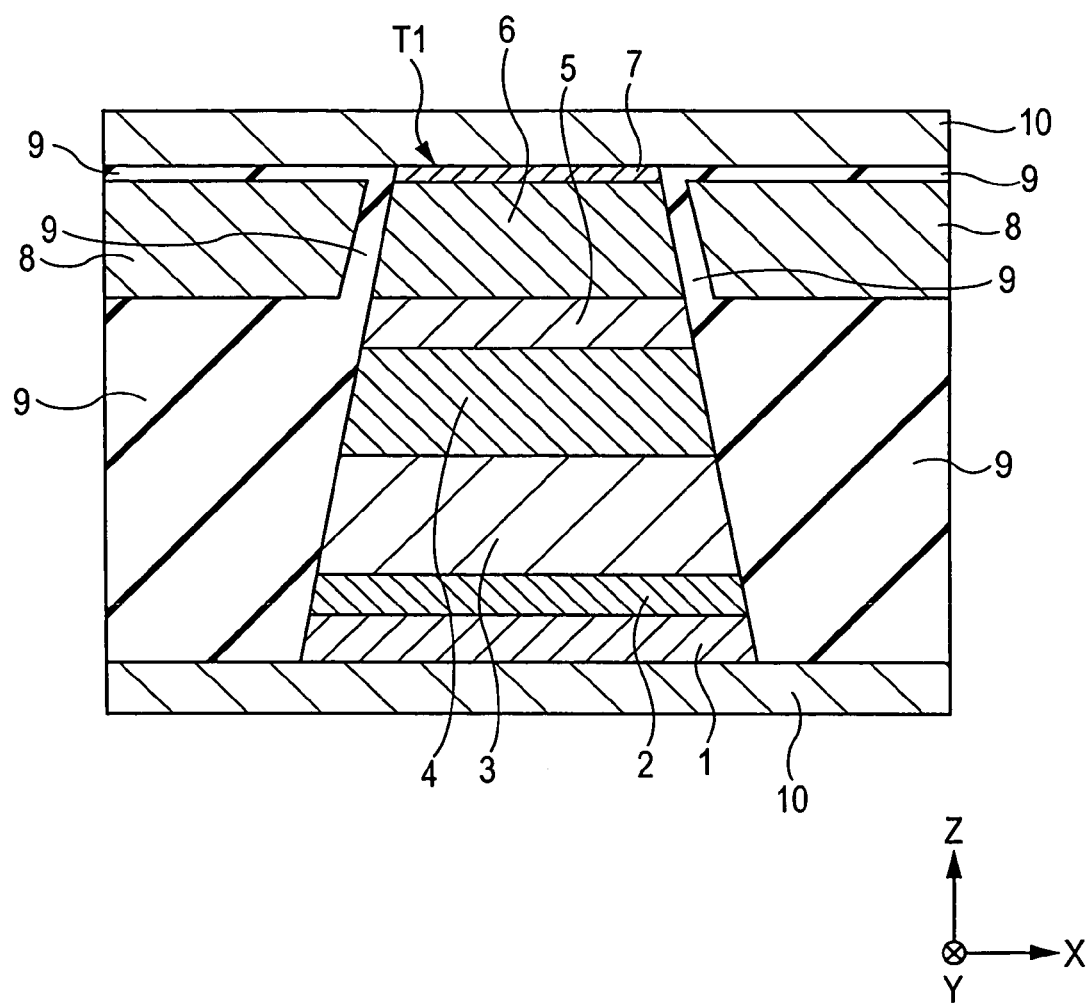
FIG. 7 is a sectional view showing a known magnetic detection element.

As is clear from FIG. 6, the magnetostriction constants λs of the free magnetic layers of the magnetic detection elements in Examples 1, 2, and 3, in which the free magnetic layer was formed from a laminate composed of a CoMnGe alloy layer and a CoMnSn alloy layer, were significantly reduced as compared with the magnetostriction constant λs of the Comparative example 1 in which the free magnetic layer was formed from the CoMnGe alloy alone.

The ΔRA of the magnetic detection element of each of Example 1 and Example 2, in which the ratio of a total film thickness of the CoMnZ alloy layer present in the free magnetic layer to a total film thickness of the free magnetic layer ([total film thickness of CoMnZ alloy layer/total film thickness of free magnetic layer]) is 0.20 or more and 0.32 or less, is larger than the ΔRA of Comparative example 1.

What is claimed is:

1. A magnetic detection element comprising:
a pinned magnetic layer whose magnetic direction is fixed in one direction; and
a free magnetic layer that is formed on the pinned magnetic layer with a nonmagnetic material layer interposed therebetween and whose magnetization direction is varied due an external magnetic field,
wherein the free magnetic layer includes a laminate composed of a CoMnX alloy layer formed from a metal compound represented by a compositional formula $Co_aMn_bX_c$ (where X represents at least one of Ge, Ga, In, Si, Pb, Zn, and Sb and a+b+c=100 atomic percent) and a CoMnZ alloy layer formed from a metal compound represented by a compositional formula $Co_dMn_eZ_f$ (where Z represents at least one of Sn and Al and d+e+f=100 atomic percent), wherein the laminate is formed with a lamination of at least three layers including the CoMnX alloy layer and the CoMnZ alloy layer.

2. The magnetic detection element according to claim 1, wherein the film thickness of the CoMnZ alloy layer is 1.0 angstrom or more and 5.0 angstroms or less.

3. The magnetic detection element according to claim 1, wherein when the lamination configuration in which each of the CoMnX alloy layer and the CoMnZ alloy layer is laminated once is taken as a unit and the film thickness ratio of the CoMnZ alloy layer to the unit is represented by [film thickness of CoMnZ alloy layer/(film thickness of CoMnX alloy layer+film thickness of CoMnZ alloy layer)], the film thickness ratio of the CoMnZ alloy layer is specified to be 0.2 or more and 0.4 or less.

4. The magnetic detection element according to claim 1, wherein a CoMnXZ alloy layer formed from a metal compound represented by a compositional formula $Co_gMn_hX_iZ_j$ (where X represents at least one of Ge, Ga, In, Si, Pb, Zn, and Sb, Z represents at least one of Sn and Al, and $g+h+i+j=100$ atomic percent) is disposed between the CoMnX alloy layer and the CoMnZ alloy layer.

5. The magnetic detection element according to claim 1, wherein the ratio of a total film thickness of at least one layer of the CoMnZ alloy layer present in the free magnetic layer to a total film thickness of the free magnetic layer ([total film thickness of CoMnZ alloy layer/total film thickness of free magnetic layer]) is specified to be 0.20 or more and 0.80 or less.

6. The magnetic detection element according to claim 5, wherein the ratio of a total film thickness of at least one layer of the CoMnZ alloy layer present in the free magnetic layer to a total film thickness of the free magnetic layer ([total film thickness of CoMnZ alloy layer/total film thickness of free magnetic layer]) is specified to be 0.20 or more and 0.32 or less.

7. The magnetic detection element according to claim 1, wherein the CoMnX alloy layer is in contact with the non-magnetic material layer.

8. The magnetic detection element according to claim 1 comprising an antiferromagnetic layer, the pinned magnetic layer which is disposed in contact with the antiferromagnetic layer and in which the magnetization direction is pinned by an exchange an isotropic magnetic field with the antiferromagnetic layer, and the free magnetic layer disposed on the pinned magnetic layer with the non-magnetic material layer therebetween.

9. The magnetic detection element according to claim 1 comprising non-magnetic material layers laminated on the top and the bottom of the free magnetic layer and the pinned magnetic layers located on one of the non-magnetic material layers and under the other non-magnetic material layer.

10. The magnetic detection element according to claim 9 comprising antiferromagnetic layers which are located on one of the pinned magnetic layers and under the other pinned magnetic layer and which pin the magnetization directions of their respective pinned magnetic layers in a constant direction by exchange anisotropic magnetic fields.

11. The magnetic detection element according to claim 1, wherein a sense current is flowed in a direction perpendicular to the film surfaces of the pinned magnetic layer, the non-magnetic material layer, and the free magnetic layer.

12. A method for manufacturing a magnetic detection element including a pinned magnetic layer in which the magnetization direction is pinned and a free magnetic layer which is disposed on the pinned magnetic layer with a non-magnetic material layer therebetween and in which the magnetization direction is varied due to an external magnetic field, the method comprising the step of disposing the free magnetic layer as a laminate composed of a CoMnX alloy layer formed from a metal compound represented by a compositional formula $Co_aMn_bX_c$ (where X represents at least one of Ge, Ga, In, Si, Pb, Zn, and Sb and $a+b+c=100$ atomic percent) and a CoMnZ alloy layer formed from a metal compound represented by a compositional formula $Co_dMn_eZ_f$ (where Z represents at least one of Sn and Al and $d+e+f=100$ atomic percent),
wherein the laminate is formed with a lamination of at least three layers including the CoMnX alloy layer and the CoMnZ alloy layer.

13. The method for manufacturing a magnetic detection element according to claim 12, wherein the film thickness of the CoMnZ alloy layer is specified to be 1.0 angstrom or more and 5.0 angstroms or less.

14. The method for manufacturing a magnetic detection element according to claim 12, wherein when the lamination configuration in which each of the CoMnX alloy layer and the CoMnZ alloy layer is laminated once is taken as a unit and the film thickness ratio of the CoMnZ alloy layer to the unit is represented by [film thickness of CoMnZ alloy layer/(film thickness of CoMnX alloy layer+film thickness of CoMnZ alloy layer)], the film thickness ratio of the CoMnZ alloy layer is specified to be 0.2 or more and 0.4 or less.

15. The method for manufacturing a magnetic detection element according to claim 12, wherein the ratio of a total film thickness of at least one layer of the CoMnZ alloy layer present in the free magnetic layer to a total film thickness of the free magnetic layer ([total film thickness of CoMnZ alloy layer/total film thickness of free magnetic layer]) is specified to be 0.20 or more and 0.80 or less.

16. The method for manufacturing a magnetic detection element according to claim 15, wherein the ratio of a total film thickness of at least one layer of the CoMnZ alloy layer present in the free magnetic layer to a total film thickness of the free magnetic layer ([total film thickness of CoMnZ alloy layer/total film thickness of free magnetic layer]) is specified to be 0.20 or more and 0.32 or less.

17. The method for manufacturing a magnetic detection element according to claim 12, wherein the CoMnX alloy layer is brought into contact with the non-magnetic material layer.

18. The method for manufacturing a magnetic detection element according to claim 12, wherein the magnetic detection element is subjected to a heat treatment after the magnetic detection element is formed.

* * * * *